United States Patent [19]
Fukuda et al.

[11] Patent Number: 5,960,373
[45] Date of Patent: Sep. 28, 1999

[54] FREQUENCY ANALYZING METHOD AND APPARATUS AND PLURAL PITCH FREQUENCIES DETECTING METHOD AND APPARATUS USING THE SAME

[75] Inventors: Hiroaki Fukuda; Mikio Tohyama, both of Hachioji; Takahiko Terada, Tsurugashima, all of Japan

[73] Assignee: Pioneer Electronic Corporation, Tokyo, Japan

[21] Appl. No.: 08/816,141

[22] Filed: Mar. 12, 1997

[30] Foreign Application Priority Data

Mar. 14, 1996 [JP] Japan .................................. 8-058132

[51] Int. Cl.$^6$ .................................................. G01R 23/16
[52] U.S. Cl. .............................................. 702/76; 702/75
[58] Field of Search .............................. 364/485; 702/75, 702/76; 704/214, 208, 207

[56] References Cited

U.S. PATENT DOCUMENTS 5,353,233 10/1994 Oian et al. ............................. 364/485
5,596,675 1/1997 Ishii et al. .............................. 395/2.2
5,664,052 9/1997 Nishiguchi et al. .................... 704/214

OTHER PUBLICATIONS

Fukuda et al. "Fundamental Frequency Estimation and Separation of Multiple Voice Parts Using Multi–Windowed STFT" Tech. Report of IEICE pp. 1–6, Mar. 1996.

*Primary Examiner*—Melanie A. Kemper
*Attorney, Agent, or Firm*—Sughrue, Mion, Zinn, Macpeak & Seas, PLLC

[57] ABSTRACT

A frequency analyzing method according to the invention is a method of analyzing frequency components of an original signal. The method has: a spectrum detecting step of detecting, from the original signal, energy levels of components of a predetermined number of orthogonal function waves which have waveforms each having same start position and end position in a predetermined time window and in which the number of occurrences of periods in the predetermined time window or frequencies are different from each other; and an orthogonal function wave changing step of changing at least one of the start position and the end position within the predetermined time window after completion of the spectrum detecting step, wherein the spectrum detecting step and the orthogonal function wave changing step are alternately repeated. According to the invention, it is possible to provide frequency analyzing method and apparatus which can contribute to estimate each correct fundamental frequency from a complex distorted wave signal such as a musical signal or the like by a relatively simple construction and to provide complex sound separating method and apparatus using the frequency analyzing method or apparatus.

16 Claims, 12 Drawing Sheets

FIG.5

TABLE (1) (WHEN L=EVEN NUMBER OF SAMPLES)

| nT \ n | 1 | 2 | 3 | 4 | ----- | $\frac{L}{2}-3$ | $\frac{L}{2}-2$ | $\frac{L}{2}-1$ | $\frac{L}{2}$ |
|---|---|---|---|---|---|---|---|---|---|
| L | L | $\frac{L}{2}$ | $\frac{L}{3}$ | $\frac{L}{4}$ | ---- | $\frac{L}{L/2-3}$ | $\frac{L}{L/2-2}$ | $\frac{L}{L/2-1}$ | $\left(\frac{L}{L/2}\right)$ |
| L−1 | L−1 | $\frac{L-1}{2}$ | $\frac{L-1}{3}$ | $\frac{L-1}{4}$ | ---- | $\frac{L-1}{L/2-3}$ | $\frac{L-1}{L/2-2}$ | $\frac{L-1}{L/2-1}$ | × |
| L−2 | L−2 | $\frac{L-2}{2}$ | $\frac{L-2}{3}$ | $\frac{L-2}{4}$ | ---- | $\frac{L-2}{L/2-3}$ | $\frac{L-1}{L/2-2}$ | $\left(\frac{L-2}{L/2-1}\right)$ | × |
| ⋮ | ⋮ | ⋮ | ⋮ | ⋮ | | ⋮ | ⋮ | ⋮ | ⋮ |
| $\frac{L}{2}+2$ | $\frac{L}{2}+2$ | $\frac{L/2+2}{2}$ | $\frac{L/2+2}{3}$ | $\frac{L/2+2}{4}$ | --- | × | × | × | × |
| $\frac{L}{2}+1$ | $\frac{L}{2}+1$ | $\frac{L/2+1}{2}$ | $\frac{L/2+1}{3}$ | $\frac{L/2+1}{4}$ | --- | × | × | × | × |

MARK ◯ INDICATES VALUE OF 2

FIG. 6

TABLE (2) (WHEN L = ODD NUMBER OF SAMPLES)

| nT \ n | 1 | 2 | 3 | 4 | ---- | L'−3 | L'−2 | L'−1 | L' |
|---|---|---|---|---|---|---|---|---|---|
| L | L | $\frac{L}{2}$ | $\frac{L}{3}$ | $\frac{L}{4}$ | ---- | $\frac{L}{L'-3}$ | $\frac{L}{L'-2}$ | $\frac{L}{L'-1}$ | × |
| L−1 | L−1 | $\frac{L-1}{2}$ | $\frac{L-1}{3}$ | $\frac{L-1}{4}$ | --- | $\frac{L-1}{L'-3}$ | $\frac{L-1}{L'-2}$ | ⓛ$\frac{L-1}{L'-1}$ | × |
| L−2 | L−2 | $\frac{L-2}{2}$ | $\frac{L-2}{3}$ | $\frac{L-2}{4}$ | --- | $\frac{L-2}{L'-3}$ | $\frac{L-2}{L'-2}$ | × | × |
| L−3 | L−3 | $\frac{L-3}{2}$ | $\frac{L-3}{3}$ | $\frac{L-3}{4}$ | --- | $\frac{L-3}{L'-3}$ | ⓛ$\frac{L-3}{L'-2}$ | × | × |
| ⋮ | ⋮ | ⋮ | ⋮ | ⋮ | | ⋮ | ⋮ | ⋮ | ⋮ |
| L'+2 | L'+2 | $\frac{L'+2}{2}$ | $\frac{L'+2}{3}$ | $\frac{L'+2}{4}$ | ---- | × | × | × | × |
| L'+1 | L'+1 | $\frac{L'+1}{2}$ | $\frac{L'+1}{3}$ | $\frac{L'+1}{4}$ | ---- | × | × | × | × |

MARK ◯ INDICATES VALUE OF 2   $L' = INT\left(\frac{L+1}{2}\right)$

INT(X) INDICATES THE OPERATION TO LEAVE INTEGER PORTION OF X

FIG. 8
- L POINTS DFT
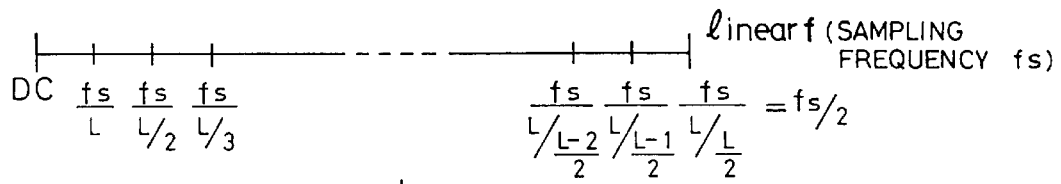
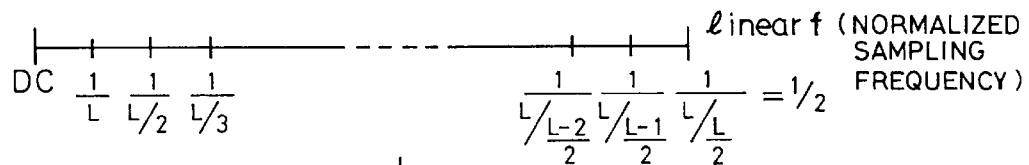
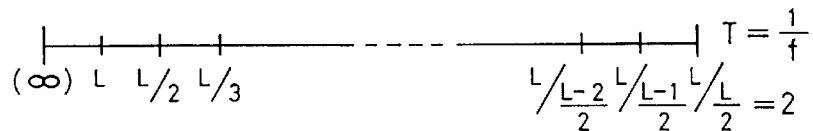
- L−1 POINTS DFT
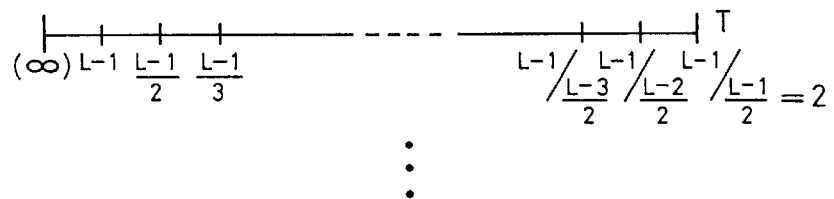
⋮
- L/2+1 POINTS DFT
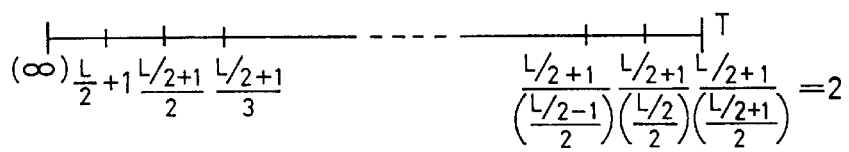

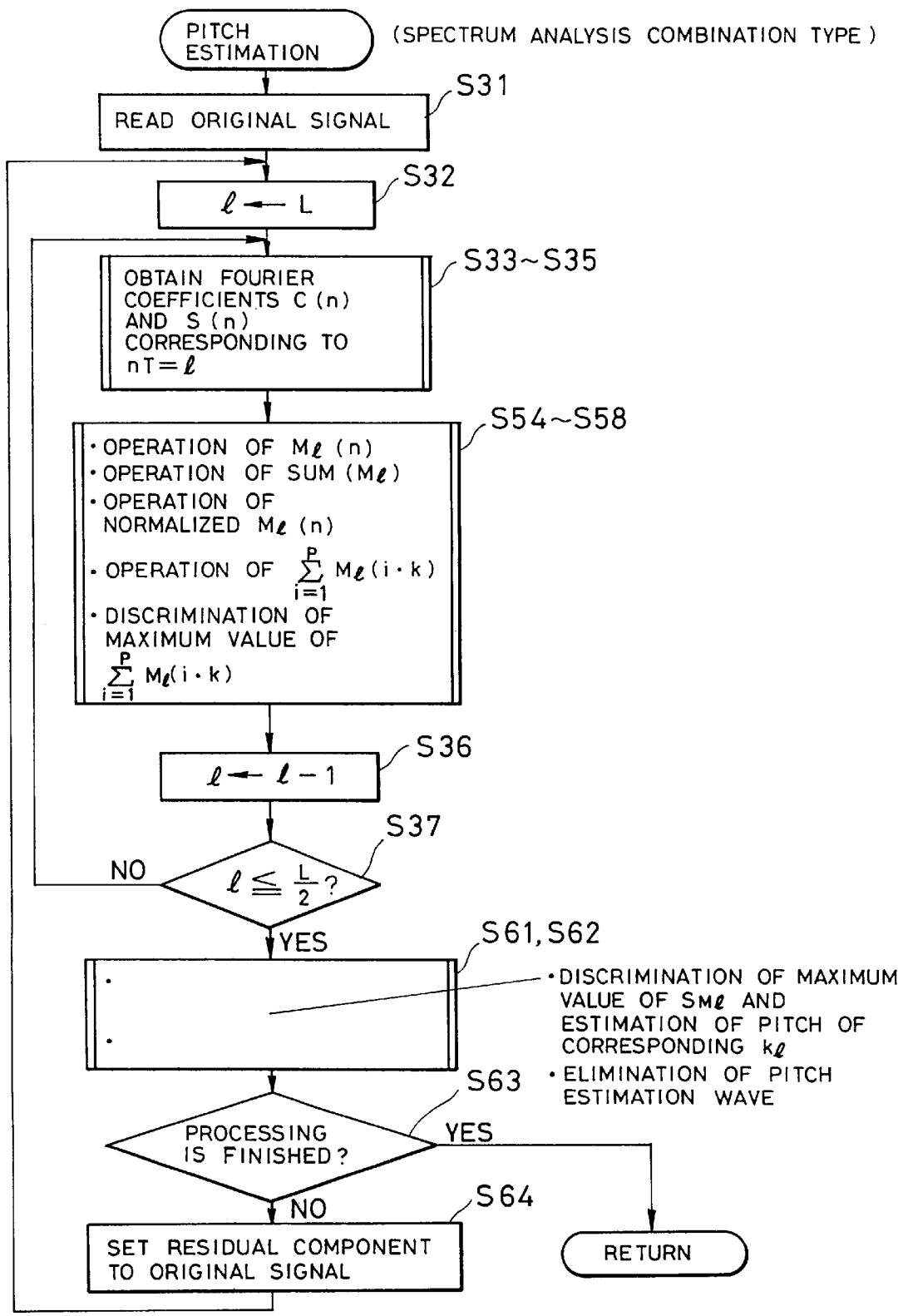

FREQUENCY ANALYZING METHOD AND APPARATUS AND PLURAL PITCH FREQUENCIES DETECTING METHOD AND APPARATUS USING THE SAME

BACKGROUND OF THE INVENTION

1. Field of the Invention

The invention relates to frequency analyzing method and frequency analyzer and further, to method and apparatus for measuring a fundamental frequency (hereinafter, referred to as a pitch frequency or simply abbreviated to a pitch) of a complex distorted wave signal of a music signal or the like.

2. Description of the Related Arts

The realization of an apparatus for producing music data from playing pieces of music is demanded from composers and other musicians who treat musical notes, and persons who are engaged in the production of MIDI (Musical Instruments Digital Interface) data of a communication Karaoke system, and the like.

Many of music information signals consist of a complex sound component including a plurality of fundamental frequency components like a multi-chorus. In a conventional pitch detecting technique, although it is relatively easy to detect a pitch for a simple tone, it is difficult to detect each pitch for a complex sound from a viewpoint of accuracy or a construction to realize an accurate detection.

OBJECT AND SUMMARY OF THE INVENTION

The invention is made in consideration of the foregoing points and it is an object of the invention to provide frequency analyzing method and apparatus which can contribute to estimation of each correct fundamental frequency from a complex distorted wave signal such as a music signal or the like by a relatively simple construction and to provide complex sound separating method and apparatus using the frequency analyzing method and apparatus.

According to the invention, there is provided a frequency analyzing method of analyzing a frequency component of an original signal, comprising: a spectrum detecting step of detecting, from the original signal, energy levels of components of a predetermined number of orthogonal function waves which have waveforms each having same start position and end position in a predetermined time window and in which the number of occurrences of periods in the predetermined time window or frequencies are different from each other; and an orthogonal function wave changing step of changing at least one of the start position and the end position in the predetermined time window after completion of the spectrum detecting step, wherein the spectrum detecting step and the orthogonal function wave changing step are alternately repeated.

According to the invention, there is provided a frequency analyzing method of analyzing a frequency on the basis of energy levels of components of a plurality of orthogonal function waves detected from an original signal, comprising: an operation discriminating step of assuming that one of the orthogonal function waves is set to a fundamental wave, executing an operation to obtain the sum of the energy level of the component of the orthogonal function wave corresponding to the fundamental wave and the energy levels of components of a predetermined number of orthogonal function waves corresponding to harmonics of the fundamental wave and having waveforms each having the same start position and end position as those of the fundamental wave in a predetermined time window each time the orthogonal function wave which is assumed as the fundamental wave is switched, and of discriminating one of the sums obtained by the operations which is regarded such that a ratio to a total level of the energy levels of the components of all of the orthogonal function waves having waveforms each having the same start position and end position as those of the orthogonal function wave corresponding to the presumed fundamental wave is largest; a repeating step of changing at least one of the start position and the end position within the predetermined time window and allowing the operation discriminating step to be executed; and an estimating step of selecting the largest sum among all of the sums discriminated by the operation discriminating step as a result of the repeating step and estimating a pitch frequency from a period or a frequency of the orthogonal function wave corresponding to the fundamental wave presumed in the operation by which the selected sum was obtained.

According to the invention, there is provided a plural pitch frequencies detecting method of detecting each pitch frequency of an original signal by using the above frequency analyzing method, further comprising: an eliminating step of eliminating from the original signal the component of the orthogonal function wave corresponding to the pitch frequency estimated by the estimating step and the component of the orthogonal function wave corresponding to harmonics of the fundamental wave corresponding to the estimated pitch frequency, wherein a residual component of the original signal which is obtained as a result of the eliminating step is set to a new original signal and each of the above steps is repeated.

According to the invention, there is provided a plural pitch frequencies detecting method of detecting each pitch frequency of an original signal, comprising: a spectrum detecting step of detecting, from the original signal, energy levels of components of a predetermined number of orthogonal function waves which have waveforms each having same start position and end position in a predetermined time window and in which the number of occurrences of periods in the predetermined time window or frequencies are different; an operation discriminating step of assuming that one of the orthogonal function waves regarding the energy level which is obtained by the spectrum detecting step is set to a fundamental wave, executing an operation to obtain the sum of the energy level of the component of the orthogonal function wave corresponding to the fundamental wave and energy levels of components of a predetermined number of orthogonal function waves corresponding to harmonics of the fundamental wave and having waveforms each having the same start position and end position as those of the fundamental wave in a predetermined time window each time the orthogonal function wave which is assumed as a fundamental wave is switched, and of discriminating one of the sums obtained by the operations which is regarded such that a ratio to a total level of the energy levels of the components of all of the orthogonal function waves having waveforms each having the same start position and end position as those of the orthogonal function wave corresponding to the presumed fundamental wave is largest; a repeating step of changing at least one of the start-position and the end position within the predetermined time window and allowing the spectrum detecting step and the operation discriminating step to be executed; an estimating step of selecting the largest sum among all of the sums discriminated by the operation discriminating step as a result of the repeating step and estimating a pitch frequency from a period or a frequency of the orthogonal function wave corresponding to the fundamental wave presumed in the operation by which the selected sum was obtained; and an eliminating step of eliminating from the original signal the component of the orthogonal function wave corresponding to the pitch frequency estimated by the estimating step and the components of the orthogonal function waves corresponding to harmonics of the fundamental wave corresponding to the eliminated pitch frequency, wherein a residual component of the original signal which is obtained as a result of the eliminating step is set to a new original signal and each of the above steps is repeated.

According to the invention, there is provided a frequency analyzing apparatus for analyzing a frequency component of an original signal, comprising: spectrum detecting means for detecting, from the original signal, energy levels of components of a predetermined number of orthogonal function waves which have waveforms each having same start position and end position in a predetermined time window and in which the number of occurrences of periods in the predetermined time window or frequencies are different; and orthogonal function wave changing means for changing at least one of the start position and the end position in the predetermined time window each time the energy levels of the components of the predetermined number of orthogonal function waves are detected.

According to the invention, there is provided a frequency analyzing apparatus for analyzing a frequency on the basis of energy levels of components of a plurality of orthogonal function waves detected from an original signal, comprising: operation discriminating means for assuming that one of the orthogonal function waves is set to a fundamental wave, executing an operation to obtain the sum of the energy level of the component of the orthogonal function wave corresponding to the fundamental wave and energy levels of components of a predetermined number of orthogonal function waves corresponding to harmonics of the fundamental wave and having waveforms each having the same start position and end position as those of the fundamental wave in a predetermined time window each time the orthogonal function wave which is assumed as a fundamental wave is switched and of discriminating one of the sums obtained by the operations which is regarded such that a ratio to a total level of the energy levels of the components of all of the orthogonal function waves having waveforms each having the same start position and end position as those of the orthogonal function wave corresponding to the presumed fundamental wave is largest; changing means for changing at least one of the start position and the end position within the predetermined time window every predetermined number of orthogonal function waves having waveforms each having the same start position and the same end position; and estimating means for selecting the largest sum among all of the sums discriminated by the operation discriminating means every predetermined number of orthogonal function waves having the waveforms each having the same start position and the same end position and estimating a pitch frequency from a period or a frequency of the orthogonal function wave corresponding to the fundamental wave presumed in the operation by which the selected sum was obtained.

According to the invention, there is provided a plural pitch frequencies detecting apparatus for detecting each pitch frequency of an original signal, comprising: spectrum detecting means for detecting, from the original signal, energy levels of components of a predetermined number of orthogonal function waves which have waveforms each having same start position and end position in a predetermined time window and in which the number of occurrences of periods in the predetermined time window or frequencies are different; operation discriminating means for assuming that one of the orthogonal function waves regarding the energy level which is obtained by the spectrum detecting means is set to a fundamental wave, executing an operation to obtain the sum of the energy levels of the components of the orthogonal function waves corresponding to the fundamental wave and energy levels of components of a predetermined number of orthogonal function waves corresponding to harmonics of the fundamental wave and having waveforms each having the same start position and end position as those of the fundamental wave in a predetermined time window each time the orthogonal function wave which is assumed as a fundamental wave is switched and of discriminating one of the sums obtained by the operations which is regarded such that a ratio to a total level of the energy levels of the components of all of the orthogonal function waves having waveforms each having the same start position and end position as those of the orthogonal function wave corresponding to the presumed fundamental wave is largest; changing means for changing at least one of the start position and the end position within the predetermined time window every predetermined number of orthogonal function waves having waveforms each having the same start position and the same end position; estimating means for selecting the largest sum among all of the sums discriminated by the operation discriminating means every predetermined number of orthogonal function waves having the waveforms each having the same start position and the same end position and estimating a pitch frequency from a period or a frequency of the orthogonal function wave corresponding to the fundamental wave presumed in the operation by which the selected sum was obtained; and eliminating means for eliminating from the original signal the component of the orthogonal function wave corresponding to the pitch frequency estimated by the estimating means and the components of the orthogonal function waves corresponding to harmonics of the fundamental wave corresponding to the estimated pitch frequency, wherein a residual component of the original signal which is obtained as a result of the eliminating means is supplied as a new original signal to the spectrum detecting means.

BRIEF DESCRIPTION OF THE DRAWINGS

FIG. 5 is a diagram showing a list of periods of the orthogonal function waves which are used in the frequency analysis that is executed in the frequency spectrum analyzing unit in the pitch detecting apparatus of FIG. 1 in the case where an analysis length is equal to the even number of samples;

FIG. 6 is a diagram showing a list of periods of the orthogonal function waves which are used in the frequency analysis that is executed in the frequency spectrum analyzing unit in the pitch detecting apparatus of FIG. 1 in the case where an analysis length is equal to the odd number of samples;

FIG. 8 is a diagram showing distributions on a frequency base and a time base of orthogonal function component waves in the frequency analyzing operation by MW-STFT that is executed in the frequency spectrum analyzing unit;

FIG. 12 is a flowchart showing the combination type pitch estimating operation performed in the frequency analyzing unit and pitch estimating unit in the pitch detecting apparatus of FIG. 1.

DETAILED DESCRIPTION OF THE EMBODIMENTS

Embodiments of the invention will now be described in detail hereinbelow on the basis of the drawings.

Figure 1:
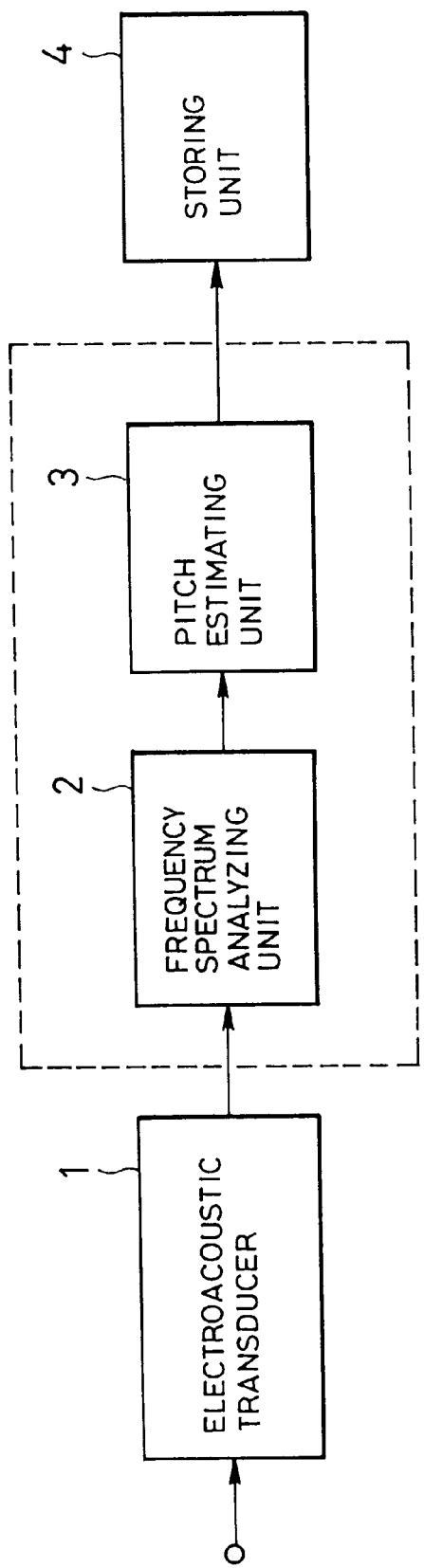
FIG. 1 is a block diagram showing an outline of a main construction of a pitch detecting apparatus according to an embodiment to which the present invention is applied.

FIG. 1 shows an outline of a main construction (hardware) of a pitch detecting apparatus according to an embodiment to which the invention is applied.

In FIG. 1, the pitch detecting apparatus has an electroacoustic transducer 1, a frequency spectrum analyzing unit 2, a pitch estimating unit 3, and a storing unit 4. The electroacoustic transducer 1 is an apparatus for converting input audio waves to an electric signal to output the signal, which is constructed by, for example, including a microphone. The conversion output signal (audio signal) of the electroacoustic transducer 1 is supplied to the frequency spectrum analyzing unit 2. The spectrum analyzing unit 2 analyzes how the input audio signal includes orthogonal function components in accordance with a method, which will be explained hereinlater, namely, obtains an energy contribution degree information of the orthogonal components in the audio signal. The information obtained is sent to the pitch estimating unit 3 and each pitch is determined on the basis of the information. A determination result of the pitch is sent to the storing unit 4 and pitch information about all of the audio waves on the time base is accumulated. The frequency spectrum analyzing unit 2 and pitch estimating unit 3 don't need to show separated functional blocks. As shown by a broken line, each function can be also realized by a single block including both of them.

The pitch detecting apparatus constructed as mentioned above is suitable as not only a general frequency analyzing apparatus but also an apparatus for detecting a pitch of audio waves when it is used in wide fields such as audio recognizing apparatus, audio synthesizing apparatus, automatic score collecting apparatus, Karaoke grading apparatus, machine diagnosing apparatus, and the like.

The following two methods are mentioned as an operation principle of the frequency spectrum analyzing unit 2.

(I) Method by an application of GHA (General Harmonic Analysis)

Figure 2:
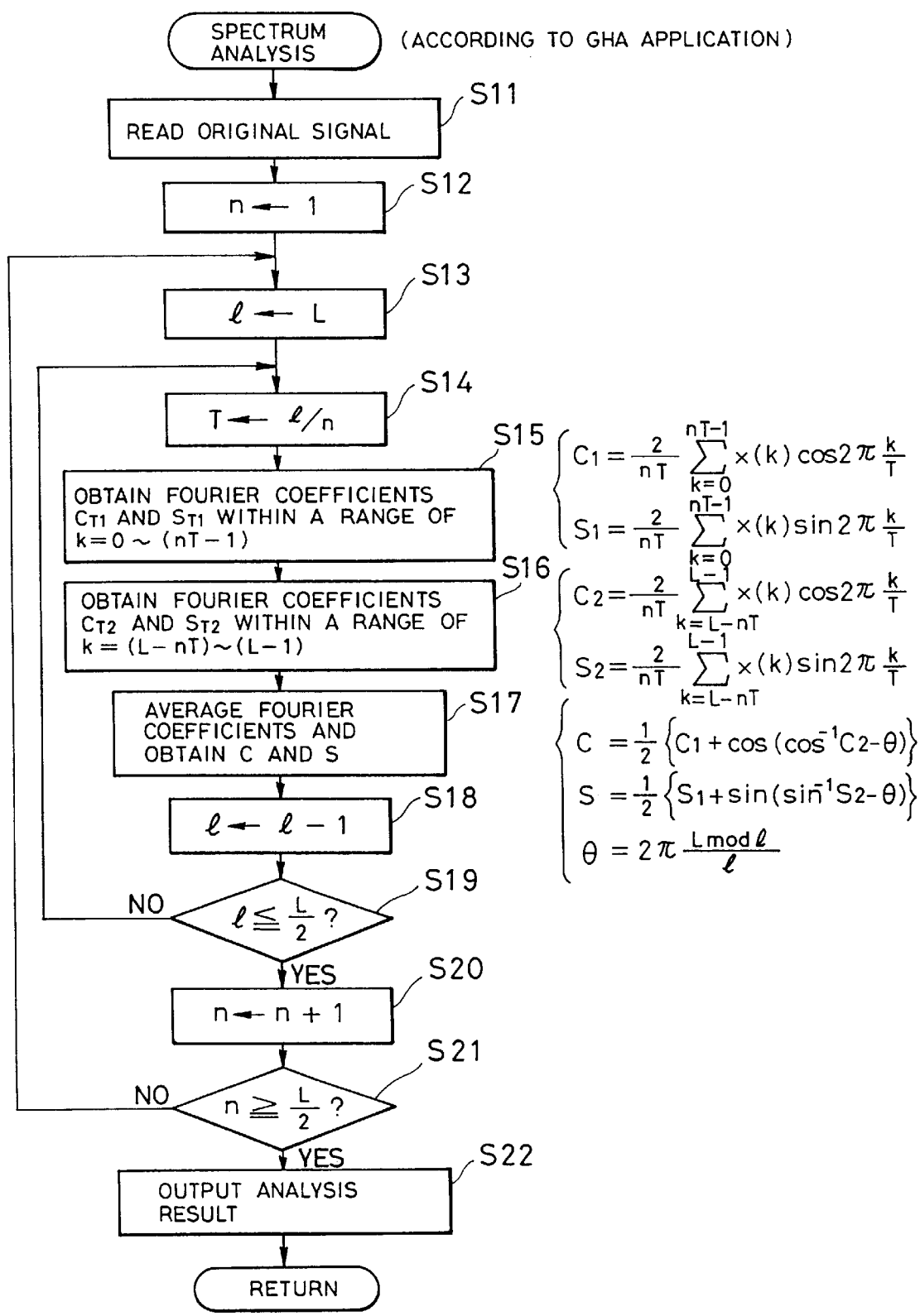
FIG. 2 is a flowchart showing the frequency analyzing operation according to an application of GHA which is performed in a frequency spectrum analyzing unit in the pitch detecting apparatus of FIG. 1.

This method can be explained in accordance with a flowchart of FIG. 2.

In FIG. 2, the spectrum analyzing unit 2 executes processes (subroutine) of the flowchart in order to analyze frequencies of the input audio signal every observation interval L (analysis length) having a predetermined time width. The analyzing unit 2 first reads an audio signal $x_0(t)$ which occupies the observation interval L (step S11). In this reading process, discrete signals $x_0(k)$ {k=0, 1, 2, ...} are obtained by sampling the original signal $x_0(t)$ at a predetermined sampling frequency fs. So long as the observation interval L corresponds to, for instance, a period of time of 512 samples, 512 discrete signals, whose sample numbers are k=0 to 511, are read. In the following description, it is assumed that L denotes the number of samples of 512.

Figure 3:
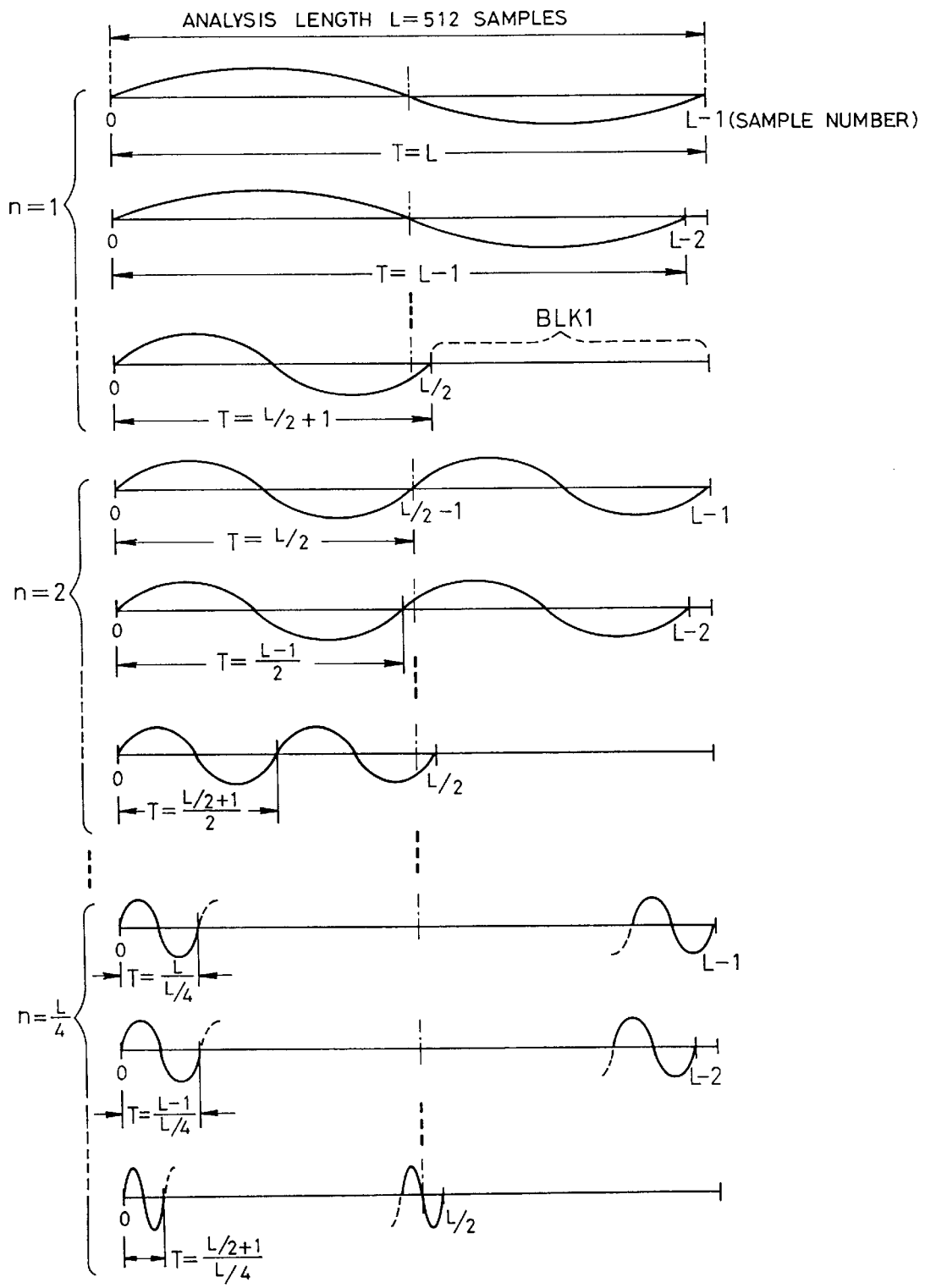
FIG. 3 is a diagram showing one of the kinds of orthogonal function waves which are used in a frequency analysis that is executed in the frequency spectrum analyzing unit in the pitch detecting apparatus of FIG. 1.

The analyzing unit 2 subsequently substitutes 1 into a variable n, substitutes a value of L into a variable l, and further substitutes a value of l/n into a variable T (steps S12, S13 and S14) and executes arithmetic operations for obtaining Fourier coefficients as shown in the following equations with respect to the predetermined values of n and T and the read signal $x_0(k)$ (step S15).

$$C_1 = \{2/(nT)\} \cdot \sum_{k=0}^{nT-1} x(k)\cos 2\pi k/T \quad (1)$$

$$S_1 = \{2/(nT)\} \cdot \sum_{k=0}^{nT-1} x(k)\sin 2\pi k/T \quad (2)$$

where, n and T are referred to FIG. 3. Namely, n and nT are integers and denote the numbers of periods of a sine wave or a cosine wave as an orthogonal function component to be analyzed in the observation interval L. T indicates a value of the period of the wave. In the wave, the position (sample number) of k=0 in the observation interval L is set to a start point and the position (sample number) of k=nT−1 is set to an end point. In step S15, when n=1 and T=512, Fourier coefficients are obtained with respect to the component of waves forming one period for the observation period L as shown at the top stage in FIG. 3.

After step S15, the analyzing unit 2 further executes an arithmetic operation to obtain Fourier coefficients as shown in the following equations (step S16).

$$C_2 = \{2/(nT)\} \cdot \sum_{k=L-nT}^{L-1} x(k)\cos 2\pi k/T \quad (3)$$

$$S_2 = \{2/(nT)\} \cdot \sum_{k=L-nT}^{L-1} x(k)\sin 2\pi k/T \quad (4)$$

Figure 4:
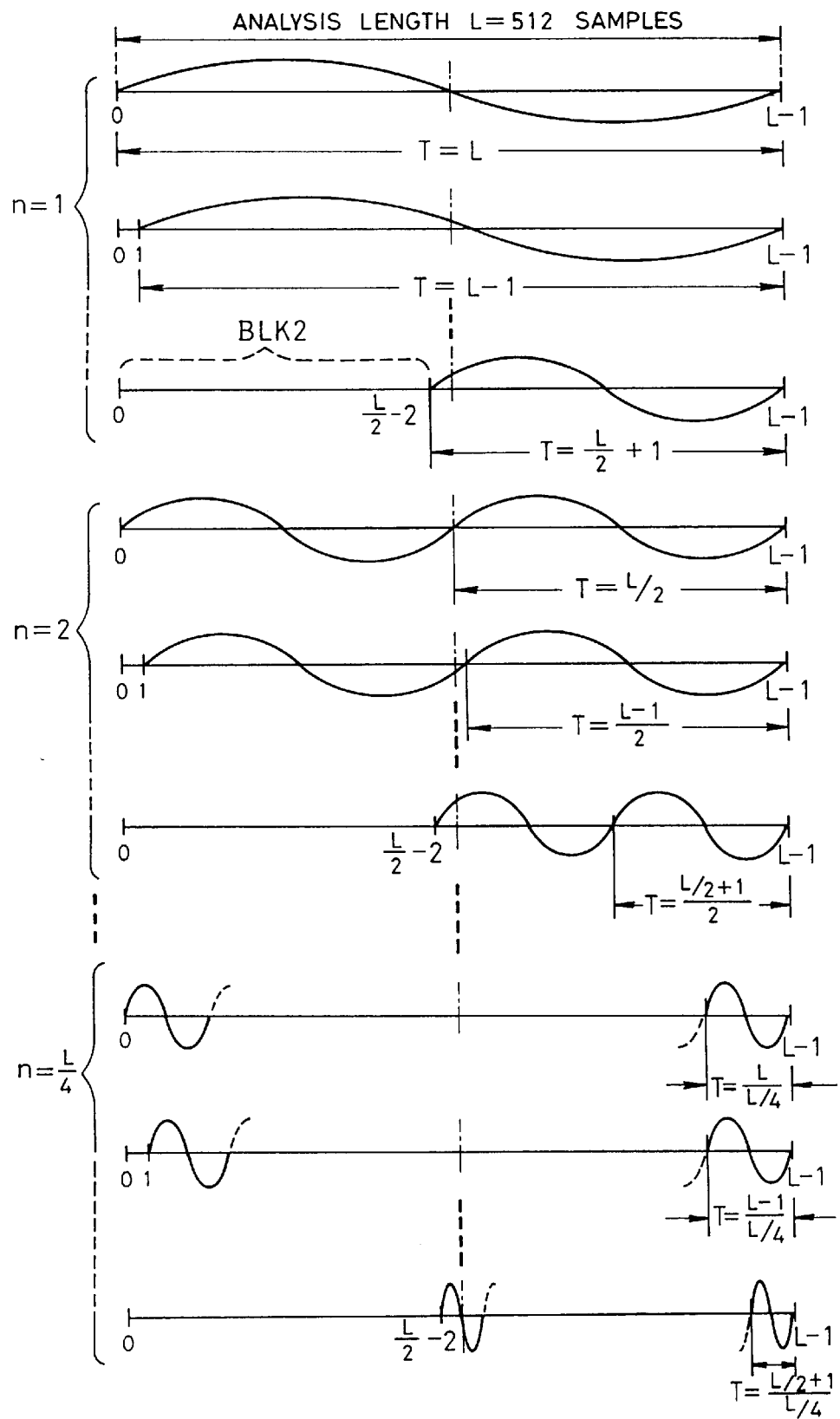
FIG. 4 is a diagram showing another one of the kinds of the orthogonal function waves which are used in the frequency analysis that is executed in the frequency spectrum analyzing unit in the pitch detecting apparatus of FIG. 1.

They are referred to FIG. 4. Although the values shown by n and T are equal, the Fourier coefficients are obtained with respect to the component of the wave in which the position of k=L−nT is set to the start position and the position of k=L−1 is set to the end position. In step S16, when n=1 and T=512, the Fourier coefficients are obtained with respect to the component of the wave forming one period for the observation period L as shown at the top stage in FIG. 4.

The analyzing unit 2 subsequently averages the coefficients obtained in steps S15 and S16 (step S17). Arithmetic operational equations for averaging are as follows.

$$C=(1/2) \{C_1+\cos(\cos^{-1} C_2-\theta)\} \quad (5)$$

$$S = (1/2) \{S_1 + \sin(\sin^{-1} S_2 - \theta)\} \quad (6)$$

$$\theta = 2\pi \cdot L \bmod l/l \quad (7)$$

where, A mod B denotes a remainder when A is divided by B.

The analyzing unit 2 obtains a pair of Fourier coefficients with respect to the component of the wave in which the position of k=0 is set to the fixed start position in step S15 and obtains a pair of Fourier coefficients with respect to the component of the wave in which the position of k=L−1 is set to the fixed end position in step S16. In step S17, the analyzing unit 2 further averages both of them and obtains the pair of Fourier coefficients corresponding to one value of the period T. The reason why the Fourier coefficients are obtained with respect to the component of the wave starting from the head and the component of the wave finishing at the end in the observation period L and are averaged is because it is considered such that now assuming that the final Fourier coefficients are set with regard to only the component of either one of the waves, when the setting of T progresses, for instance, a blank portion BLK1 exists in FIG. 3, a blank portion BLK2 exists in FIG. 4, the Fourier coefficients regarding only the component of the one wave are set to virtual values which are also the same with respect to those blank portions, so that the reliability of the Fourier coefficients of the frequency component regarding T deteriorates. By obtaining and averaging the Fourier coefficients, therefore, about the components of both waves in steps S15 to S17, the precision and reliability of the final Fourier coefficients can be improved without performing the predictive analysis with respect to the blank portions.

After completion of step S17, the analyzing unit 2 subtracts 1 from the value of l (step S18). Whether the subtracted value of l is equal to or less than the value of L/2 or not is discriminated (step S19).

In step S19, when the value of l is smaller than the value of L/2, the analyzing unit 2 advances to step S14 and executes the processes in steps S15 to S18 with respect to the new value of T which is obtained by substituting the subtracted value of l. Referring again to FIGS. 3 and 4, in steps S15 and S16, when n=1 and T=l/n=511/1=511, the Fourier coefficients are obtained with regard to the component of the wave which is shorter than the preceding wave by one sample and, as shown at the second stages in FIGS. 3 and 4. When n=1, the period of T is gradually reduced by cyclic flow in steps S14 to S19 and the corresponding Fourier coefficients are obtained with respect to each of T=L, L−1, L−2, . . . , and L/2.

When it is determined in step S19 that the value of l is equal to or less than the value of L/2, the analyzing unit 2 adds 1 to the value of n (step S20) and discriminates whether the added value of n is equal to or larger than the value of L/2 or not (step S21).

When the value of n is smaller than the value of L/2 in step S21, the analyzing unit 2 progresses to step S13, again returns the value of l to the value of L, and executes the processes in steps S15 to S19 with respect to the new value of T which is obtained by substituting the value of l and the added value of n. The cyclic flow in steps S14 to S19 as mentioned above is again executed. Since n=2 in this case, however, the value of T to be set differs from that of the cyclic flow. Referring to FIGS. 3 and 4, as shown in the column of n=2, the target of analysis is now the component of the wave having two periods, whereby T is set such that T=L/2, (L−1)/2, . . . , and (L/2+1)/2 and the corresponding Fourier coefficients are obtained with respect to each of them.

The processes in the cyclic flow are executed every value of n as mentioned above, so that the value of T which is set in accordance with the values of n and l gradually decreases as shown in FIGS. 3 and 4. Similarly, T is set such that T=L/(L/4), (L−1)/(L/4), . . . , (L/2+1)/(L/4) under a condition of n=L/4 to obtain the Fourier coefficients with respect to each of them.

In step S21, when it is decided that the value of n is equal to or larger than the value of L/2, all of the Fourier coefficients obtained so far in step S17 are made correspond to the value of T and supplied to the pitch estimating unit 3 (step S22). After completion of step S22, the processing routine advances to the main routine and the apparatus waits for the execution of the main routine with respect to the next observation interval L on the time sequence.

The value of T to be set by the main routine is as shown in FIG. 5 or 6. FIG. 5 shows the case when L is an even number. FIG. 6 shows the case when L is an odd number. In FIG. 6, INT[x] is a function for remaining an integer part of x and used to define L'=INT[(L+1)/2]. The values of n are arranged in the lateral direction, the values of nT are arranged in the vertical direction, and the values of T are shown in correspondence to the values in the lateral and vertical directions.

According to the Tables of FIGS. 5 and 6, it will be understood that the setting (Fourier coefficient operating process) of T based on the GHA as shown in FIG. 2 is executed along the vertical direction in the Tables while sequentially changing the value of nT every value of n.

(II) Method by MW-STFT (Multi-Windowed Short Time Fourier Transform)

Figure 7:
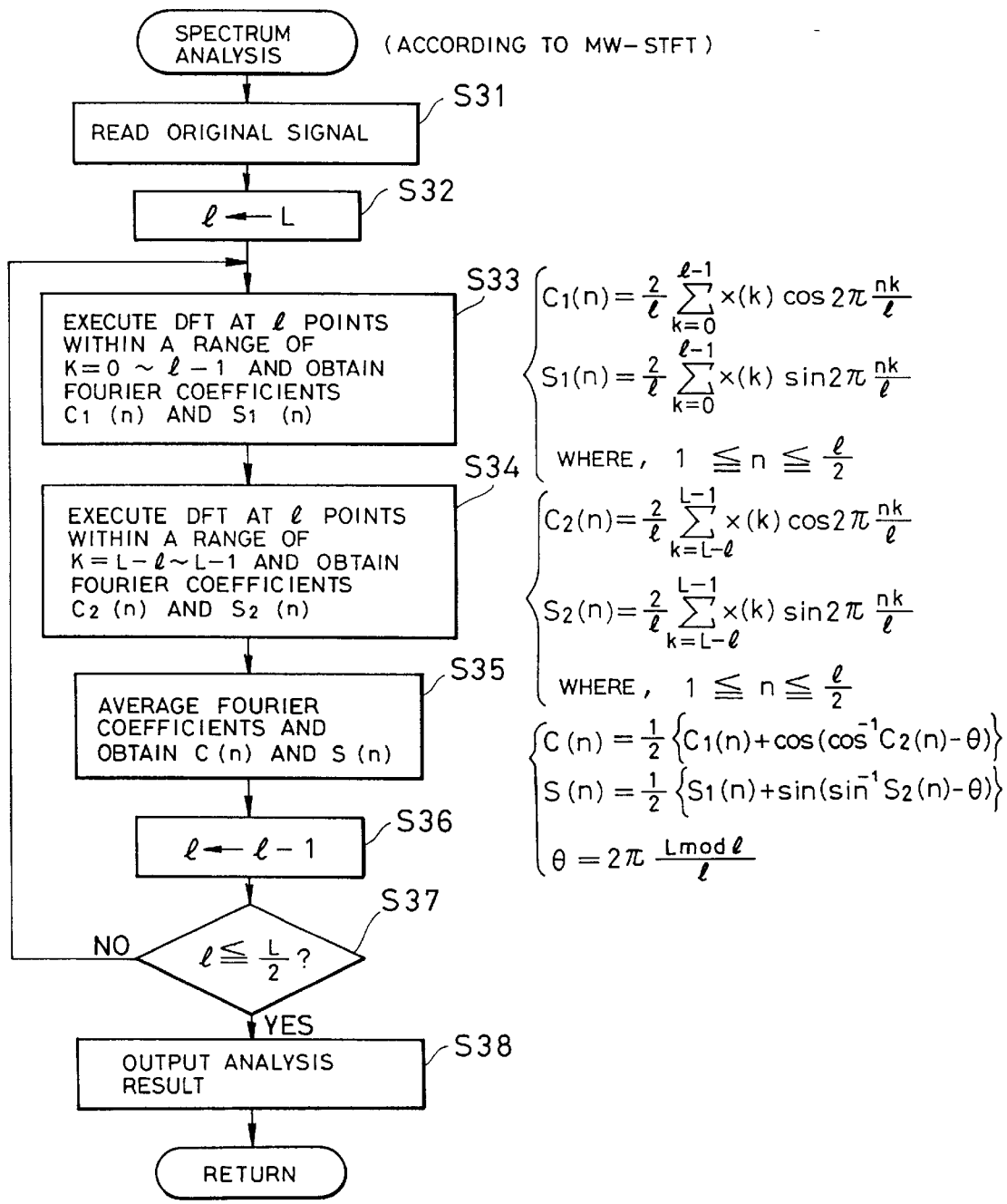
FIG. 7 is a flowchart showing the frequency analyzing operation by MW-STFT which is executed in the frequency spectrum analyzing unit in the pitch detecting apparatus of FIG. 1.

This method can be explained in accordance with a flowchart of FIG. 7.

In a manner similar to FIG. 2, the analyzing unit 2 executes processes (subroutine) of the flowchart in order to analyze frequency of the input audio signal every observation interval L (analysis length) having a predetermined time width. In a manner similar to FIG. 2 as well, the analyzing unit 2 first reads the audio signal $x_0(t)$ which occupies the observation interval L as discrete signals $x_0(k)$ {k=0, 1, 2, . . . } which are obtained by sampling at a predetermined sampling frequency fs (step S31). Explanation will now be also made on the assumption that L is set to a predetermined number of samples such as 512 samples.

The analyzing unit 2 subsequently substitutes the value of L into the variable l (step S32) and executes an arithmetic operation to obtain the Fourier coefficients as shown by the following equations with respect to the predetermined l and the read signals $x_0(k)$ (step S33).

$$C_1(n) = (2/l) \cdot \sum_{k=0}^{l-1} x(k)\cos 2\pi nk/l \quad (8)$$

$$S_1(n) = (2/l) \cdot \sum_{k=0}^{l-1} x(k)\sin 2\pi nk/l \quad (9)$$

where l corresponds to nT in the Table of FIG. 5 or 6 mentioned above. The arithmetic operation of the equations (8) and (9) is executed In the range of $1 \leq n \leq l/2$, namely, so long as l=L, with respect to the values of n of each of n=1, 2, 3, . . . , L/2−1, and L/2 or n=1, 2, 3, . . . , L'−2, and L'−1. When referring to FIG. 3, this process corresponds to that as shown at the first, fourth, and seventh stages from the top, in a state in which a length (distance between the start position and the end position of the wave) of the wave as a target of analysis is fixed to L (=l ), the Fourier coefficients are obtained while changing the frequency (namely, changing the value of n). This means that a DFT (Discrete Fourier Transform) at l points is executed. The relation between the DFT and the process to obtain the Fourier coefficients in FIG. 2 can be also described by FIG. 8.

At the first stage from the top in FIG. 8, the L points DFT obtains the Fourier coefficients at the points of fs/L, fs/(L/2), fs(L/3), . . . , fs/[L/{(L−2)/2}], fs/[L/{(L−1)/2}], and fs/{L/(L/2)} under the sampling frequency fs of the original signal on a frequency base in which the left edge is set to a DC component and a value of frequency linearly increases as a position approaches to the right. By normalizing the frequency base by fs, as shown at the second stage, the points to obtain the Fourier coefficients can be captured as 1/L, 1/(L/2), 1/(L/3), . . . , 1/[L/{(L−2)/2 }], 1/[L/{(L−1)/2}], and 1/{L/(L/2)}. By further converting the normalized frequency base into the time base, as shown at the third stage, the points can be captured as L, L/2, L/3, . . . , L/{(L−2)/2}, L/{(L−1)/2}, and L/(L/2). When seeing each point at the third stage, it finally corresponds to the value of each T in the row of nT=L as shown in the Table of FIG. 5 and it will be understood that the values of T are set in the direction intersecting the setting direction of the values of T in the processes of FIG. 2.

The analyzing unit 2 further executes arithmetic operations to obtain the Fourier coefficients as shown in the following equations (step S34).

$$C_2(n) = (2/l) \cdot \sum_{k=0}^{l-1} x(k)\cos 2\pi nk/l \quad (10)$$

$$S_2(n) = (2/l) \cdot \sum_{k=0}^{l-1} x(k)\sin 2\pi nk/l \quad (11)$$

Although l is also used in a manner similar to the equations (9) and (10) here, the analysis interval differs. By referring to FIG. 4, the Fourier coefficients are obtained with respect to the component of the wave in which the position of k=L−1 is set to the end position as shown at the first, fourth, and seventh stages from the top.

The analyzing unit 2 subsequently averages the Fourier coefficients obtained in steps S33 and S34 (step S35). Arithmetic operational equations for averaging are as follows.

$$C(n)=(1/2) \{C_1(n)+\cos (\cos^{-1} C_2^-(n)-\theta)\} \quad (12)$$

$$S(n)=(1/2) \{S_1(n)+\sin (\sin^{-1} S_2(n)-\theta)\} \quad (13)$$

$$\theta=2 \pi \cdot L \bmod l/l \quad (14)$$

where, A mod B denotes a remainder when A is divided by B.

The analyzing unit 2 obtains a pair of Fourier coefficients every possible value of n with respect to the component of the wave in which the position of k=0 is set to the fixed start position in step S33 and obtains a pair of Fourier coefficients every value of n with respect to the component of the wave in which the position of k=L−1 is set to the fixed end position in step S34. In step S35, the analyzing unit 2 further averages both of them to obtain a pair of Fourier coefficients corresponding to one value of the period T every value of n. The reason why the Fourier coefficients are obtained with respect to the component of the wave starting from the head and with respect to the component of the wave finishing at the end in the observation period L and are averaged is similar to the case of FIG. 2.

After the final Fourier coefficients were obtained in step S35, the analyzing unit 2 subtracts 1 from the value of l (step S36). Whether the subtracted value of l is equal to or less than the value of L/2 or not is discriminated (step S37). If NO, the processing routine advances to step S33.

As mentioned above, in step S33 after completion of step S37, the processes in steps S33 to S36 are executed with respect to the subtracted value of l. Referring to FIGS. 3 and 4, in steps S33 and S34, when l=511, the Fourier coefficients are obtained with respect to the value of each n using the component of the wave which is shorter than the preceding wave by one sample as shown at the second, fifth, and eighth stages in FIGS. 3 and 4. Referring to a Table of FIG. 5 or 6, the Fourier coefficients corresponding to the value of each n of the row of nT=L−1 are obtained.

The cyclic flow in steps S33 to S37 continues until the value of k is equal to the value of L/2 and the corresponding Fourier coefficients are obtained in accordance with the order of the rows of nT=L, L−1, L−2, . . . , and L/2 in the Table of FIG. 5 or 6 with respect to those rows and each value of n. It should be also understood from the Tables of FIGS. 5 and 6 that the number of points of the DFT in steps S33 and S34 is reduced by one point each time the value of nT (namely, l) is reduced by 2.

When it is determined in step S37 that the value of l is equal to or less than the value of L/2, the analyzing unit 2 supplies all of the Fourier coefficients obtained so far in step S35 to the pitch estimating unit 3 in association with the values of T (step S38). After completion of step S38, the processing routine advances to the main routine and the apparatus waits for the execution of this routine with respect to the next observation interval L on the time sequence.

It is noted that, as can be seen from the above description, the setting (Fourier coefficient operating process) of T by the MW-STFT as shown in FIG. 7 is executed along the lateral direction in the Table of FIG. 5 or 6 by sequentially changing the value of n every value of nT.

The pitch estimating unit 3 estimates a pitch of each sound constructing the complex sound by using the Fourier coefficients obtained as described in the foregoing item (I) or (II). The estimating principle can be described in accordance with flowcharts of FIGS. 9 and 10.

Figure 9:
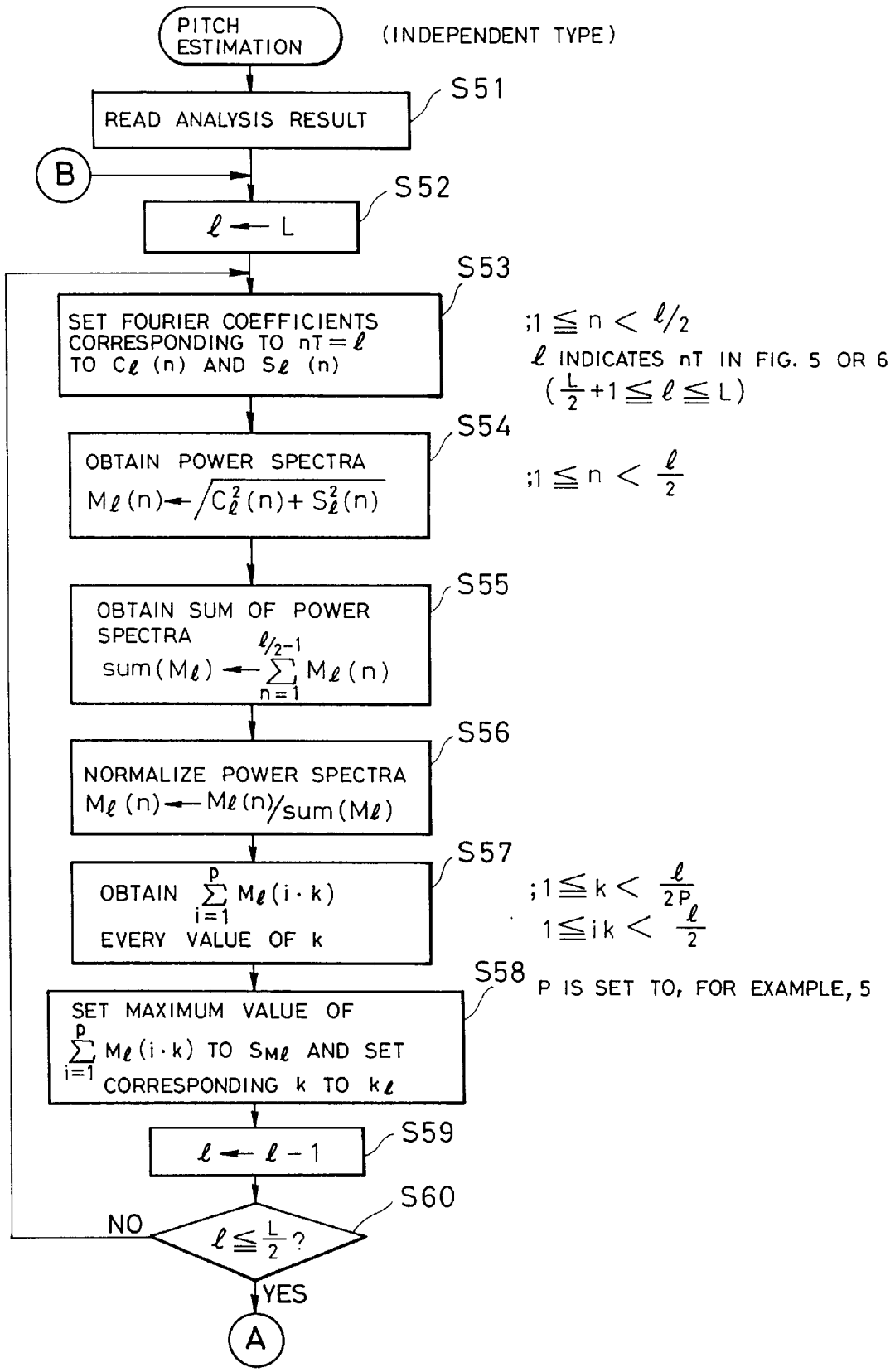
FIG. 9 is a flowchart showing a part of a pitch estimating operation of the independent type which is executed in a pitch estimating unit in the pitch detecting apparatus of FIG. 1.
Figure 10:
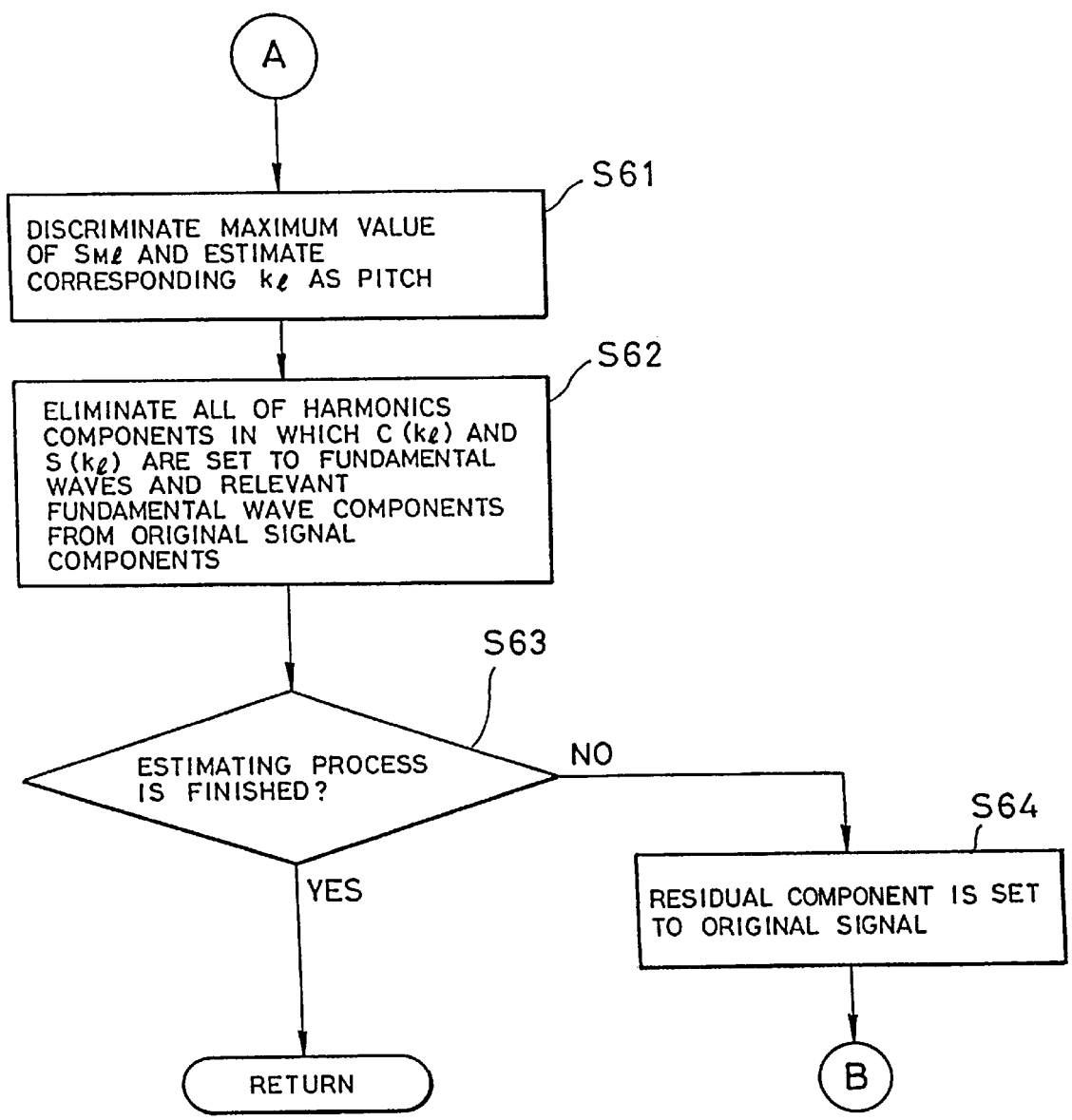
FIG. 10 is a flowchart showing another part of the pitch estimating operation of the independent type which is executed in the pitch estimating unit in the pitch detecting apparatus of FIG. 1.

In FIGS. 9 and 10, the estimating unit 3 reads the Fourier coefficients as information from the analyzing unit 2 and the values of T corresponding to the coefficients (step S51) and substitutes the value of L into l (step S52). The estimating unit 3 recognizes the decided value of l as a value of nT in the Table of FIG. 5 or 6 and temporarily stores each pair of Fourier coefficients corresponding to the rows of the values of nT and corresponding to n=1, 2, 3, . . . (where, 1≦n<l/2) into variables $C_l(n)$ and $S_l(n)$ (step S53). When l=L in step S53, the Fourier coefficients corresponding to the respective values {L, L/2, L/3, . . . , L/(L/2−1), L/(L/2)} or {L, L/2, L/3, . . . , L/(L'−2), L/(L'−1)} of T of the first row in the Table of FIG. 5 or 6 are set to $C_L(n)$ and $S_L(n)${(n=1, 2, . . . , L/2} or (n=1, 2, . . . , L'}.

With respect to the values of $C_l(n)$ and $S_l(n)$ which were temporarily stored, the estimating unit 3 executes an arithmetic operation to obtain an amplitude (what is called a power spectrum) of a sine wave as shown in the following equation every value (1≦n<l/2) of n (step S54).

$$M_l(n)=\sqrt{\{C_l^2(n)+S_l^2(n)\}} \quad (15)$$

The estimating unit 3 further obtains the sum of the power spectra (step S55). An arithmetic operational equation for this purpose is as follows.

$$\text{sum } (M_l) = \sum_{n=1}^{l/2-1} M_l(n) \qquad (16)$$

Each of $M_l(n)$ obtained by the equation (15) is normalized by using the sum (step S56). An arithmetic operational equation for this purpose is as follows.

$$M_l(n)/\text{sum } (M_l) \qquad (17)$$

The values just obtained are set to the new values of $M_l(n)$.

On the basis of the normalized $M_l(n)$, the estimating unit 3 executes the following arithmetic operation $$\sum_{i=1}^{p} M_l(i \cdot k) \qquad (18)$$

every value ($1 \leq k < 1/2$ p) of k (step S57) (where, $1 \leq ik < 1/2$). For example, 5 is used as a value of p. Although it is decided on the basis of a phenomenon known by experience such that in a song or the like, the harmonics components higher than the fifth degree extremely decrease, the value of p can be also properly changed or adjusted.

When a certain frequency component is regarded as a fundamental frequency component, since the components of frequencies which are two, three, four, and five times as high as the fundamental frequency ought to appear, the process in step S57 is comparable to a process for obtaining a sum amplitude of the amplitudes of the fundamental frequency component and the frequency components which are integer times as high as the fundamental frequency.

For example, an arithmetic operation with respect to k=1 under l=L in step S57 is as follows.

$$\sum_{i=1}^{5} M_l(i \cdot 1) = M_l(1) + M_l(2) + M_l(3) + M_l(4) + M_l(5) \qquad (19)$$

The frequency regarding T=L corresponding to nT=L and n=1 in the Table of FIG. 5 or 6 is regarded as a fundamental frequency, the amplitudes of the frequency components which are derived by the Fourier coefficients corresponding to n=1, 2, 3, 4, 5 (T=L, L/2, L/3, L/4, L/5) are added, and the total amplitude is obtained. When another example is now mentioned, in step S55, an arithmetic operation about k=2 under l=L is as follows.

$$\sum_{i=1}^{5} M_l(i \cdot 2) = M_l(2) + M_l(4) + M_l(6) + M_l(8) + M_l(10) \qquad (20)$$

The frequency regarding T=L/2 corresponding to nT=L and n=2 in the Table of FIG. 5 or 6 is regarded as a fundamental frequency, the amplitudes of the frequency components which are obtained by the Fourier coefficients corresponding to n=2, 6, 8, 10 (T=L/2, L/4, L/6, L/8, L/10) are added, and the total amplitude is obtained. The same shall also similarly apply to arithmetic operations on k=3 and after k=3. As the value of k increases, an interval on the frequency base of the frequency components to be added is obviously widened.

Further, the estimating unit 3 selects a maximum one from the total values of the amplitudes of the respective values of k (or n) obtained in step S57, stores the selected maximum value into a variable $S_{Ml}$, and stores the value of k corresponding to the maximum value into a variable $k_l$ (step S58).

Thus, the maximum total value of the amplitudes is obtained with respect to the Fourier coefficients regarding the value of each T corresponding to the row (line-up in the lateral direction) of nT=L in the Table of FIG. 5 or 6. Now, assuming that the sum of the amplitudes by the above equation (20) is equal to the maximum value, it is recognized that the spectrum level of the component in which the frequency according to T=L/2 corresponding to k=2, namely n=2 is set to a fundamental frequency is largest in the row of nT=L.

After that, the estimating unit 3 subtracts 1 from the value of l (step S59) and discriminates whether the subtracted value of l is equal to or less than the value of l/2 or not (step S60). If NO, the processing routine advances to step S53. In step S53 subsequent to step S60, new l decided in step S59 is now recognized as a value of nT in the Table of FIG. 5 or 6 as mentioned above. Now, assuming that L indicates the even number of samples and the new value of l is equal to L−1, in FIG. 5, each pair of Fourier coefficients regarding the values of T corresponding to the row of nT=L−1 and corresponding to n=1, 2, 3, . . . is temporarily stored into the variables $C_l(n)$ and $S_l(n)$. The processes in steps S54 to S59 are again executed and $S_{Ml}$ and $k_l$ with respect to the row of nT=L−1 are obtained.

By repeating the cyclic flow in steps S53 to S60, $S_{Ml}$ and $k_l$ with respect to each row of nT=L, L−1, L−2, . . . , L/2+2, L/2+1, L/2 in the Table of FIG. 5 or 6 are obtained.

When it is decided in step S60 that the value of l is equal to or less than L/2, the estimating unit 3 determines that the processes with regard to the rows of up to nT=L/2+1 in the Table of FIG. 5 or 6 have been finished, selects the maximum value among $S_{Ml}$ {l=L, L−1, . . . , L/2+1} obtained so far, and further recognizes $k_l$ corresponding to the selected $S_{Ml}$ as information of n to derive the pitch frequency, namely, pitch (step S61). Since n indicates the number of periods of the waves at an analysis length of L, the corresponding frequency can be derived from the value of $k_l$. The pitch frequency information derived is sent to the storing unit 4 and stored therein. At the post stage of the storing unit 4, a print, a display output, an acoustic output, or another presentation of the pitch frequency information is carried out by an output system (not explained in detail).

Subsequently, the estimating unit 3 sets the frequency components which are derived by the Fourier coefficients $C(k_l)$ and $S(k_l)$ corresponding to $k_l$ recognized as a pitch in step S61 to the fundamental wave, obtains all of the harmonics components of the fundamental wave from the Fourier coefficients $C(2k_l)$, $S(2k_l)$, $C(3k_l)$, $S(3k_l)$, $C(4k_l)$, $S(4k_l)$, . . . , and eliminates those fundamental component and harmonics components from the original signal component (step S62).

After completion of step S62, a discrimination about whether the routine of a pitch estimating process should be finished or not is made (step S63). The discrimination can form various forms. For example, there is a form such that the routine is finished when the pitch estimation in step S61 has been carried out the number of times designated by the user. Alternatively, it may be also possible to construct in a manner such that a fact that the whole spectrum level of the residual component obtained in step S62 is equal to or less than a predetermined value is detected and the routine is finished on the basis of the detection result.

When it is decided in step S63 that the pitch estimating process is not finished but is continued, the estimating unit 3 replaces the original signal after completion of the elimination in step S62, namely, the residual component as a new original signal which is a next target of the pitch estimation (step S64) and advance s to step S52. After going from step S64 to step S52 as well, the estimating unit 3 again executes the processes in steps S52 to S62 as mentioned above. However, since the process about the residual component (estimation of the pitch) is executed, a pitch different from the pitch estimated in preceding step S61 is estimated. For example, therefore, when the original signal has three pitches, each pitch is sequentially estimated by repeating the processes in steps S52 to S62 three times. If the original signal comprises, for example, audio components of respective parts of a trio, the pitch frequency of each part sound is obtained.

Figure 11:
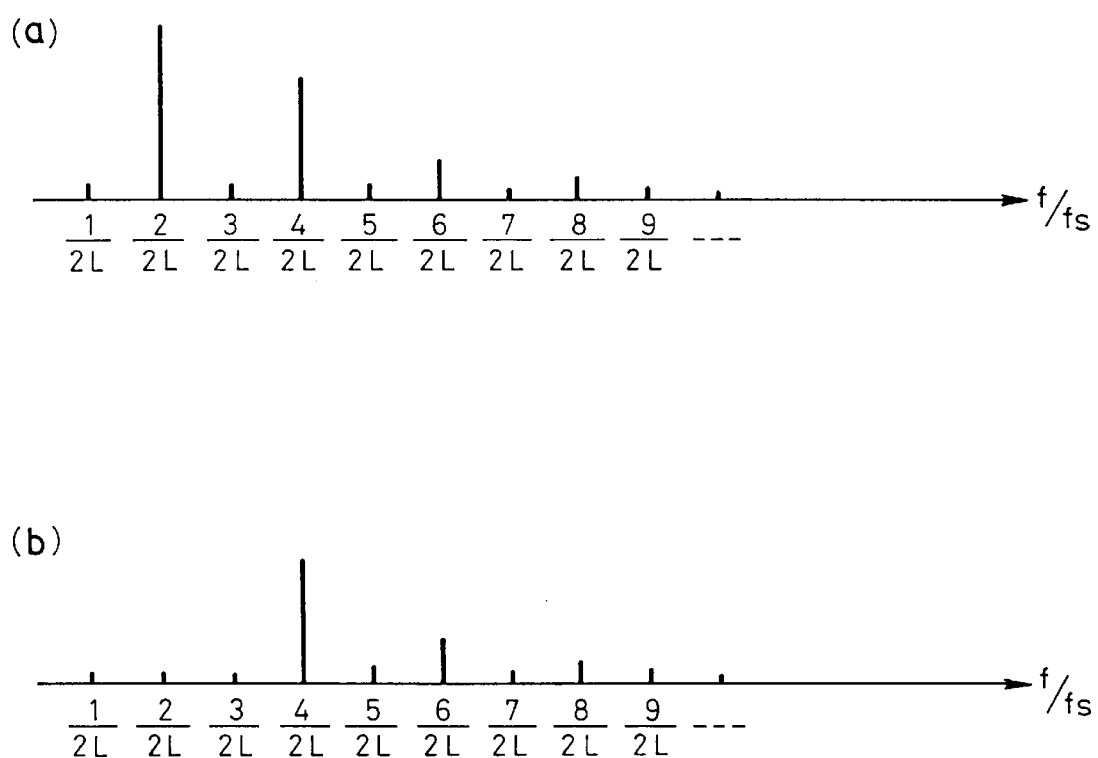
FIG. 11 shows spectrum diagrams for explaining operation and effect which are derived by a pitch estimating process according to the present invention.

Since the pitch estimating process explained above estimates the pitch by paying attention to the relation of the harmonics, it is hardly influenced by noises. Such an effect will now be described in detail with reference to FIG. 11. It is now assumed that in a normal case, when a discrete Fourier transformation at L points is performed for the original signal, a spectrum distribution as shown in (a) in FIG. 11 is obtained. In FIG. 11, an axis of abscissa indicates a frequency base normalized by the sampling frequency. In this case, it is possible to decide that a fundamental frequency of (a) in FIG. 11 is a frequency corresponding to 2/(2L) of the highest spectrum level.

It is assumed that the frequency components of 3/(2L) or less are lost due to some causes such as noise or the like and a spectrum distribution is as shown in (b) in FIG. 11. If the changed distribution is simply judged, in this case, it will be estimated that the fundamental wave in (b) in FIG. 11 has a frequency corresponding to 4/(2L) of the highest spectrum level.

Even in the above cases, however, in step S57, $$\sum_{i=1}^{p} M_l(i \cdot k)$$

becomes maximum only when hypothesizing that the fundamental wave has the frequency of 2/(2L). Even if the information of the fundamental wave, therefore, is lost in the original signal as shown in (b) in FIG. 11, a frequency that is equivalent to the pitch frequency estimated in (a) in FIG. 11 can be estimated.

Although the pitch estimating processes shown in FIGS. 9 and 10 are executed after the spectrum analysis results were previously obtained by the processes shown in FIGS. 2 and 7, it is also possible to process in a combination form of the spectrum analyzing process and the pitch estimating process as follows.

FIG. 12 shows a processing procedure for the combination type pitch estimation, in which portions similar to those in FIGS. 7, 9, and 10 are designated by the same reference numerals.

In FIG. 12, while obtaining the Fourier coefficients for n=1, 2, 3, . . . every row indicated by the value of each nT in the Table of FIG. 5 or 6, frequency components including (p−1) harmonics (or overtone) components in the row are evaluated.

In more detail, first, a reading process of the original signal in step S31 and a setting process of l in step S32 are sequentially executed. In steps S33 to S35, final Fourier coefficients C(n) and S(n) obtained by averaging the Fourier coefficients corresponding to the row of nT=1 in the Table of FIG. 5 or 6 and derived by two kinds of ranges of k are obtained. The processes in steps S33 to S35 are a part of the spectrum analyzing process by the MW-STFT in FIG. 7 and are characterized in that the Fourier coefficients are obtained on a row unit basis in the Table of FIG. 5 or 6. That is, the Fourier coefficients which are obtained on a row unit basis enable evaluating processes in subsequent steps S54 to S58 accompanied with the processes of the row unit to be immediately executed from the processes in steps S33 to S35.

As mentioned above, in the embodiment, the sum of the power spectra of up to the harmonics components of, for example, the fifth degree of the frequencies of the fundamental waves is obtained in accordance with the order from the fundamental wave having a low frequency component and then the frequency of the fundamental wave when the sum is maximum is estimated as a pitch. In this instance, when the fundamental waves in which the sums of the power spectra are equal exist in parallel, since the fundamental wave having a lower frequency component is set to the pitch, for example, if the estimating process of the invention is applied to a specific original signal such that noises are uniformly distributed in a whole band, then there may be a case where the pitch is erroneously estimated.

To avoid the error, it is also possible to use a method whereby by using a principle such that in case of voiced sound, as the sound becomes an harmonics component, the power spectrum exponentially decreases. When the sum of the power spectra is obtained, for instance, the following weights are assigned to the power spectra of the harmonics components.

Power spectrum of the frequency component assuming fundamental tone . . . X 1

Power spectrum of the frequency component assuming 2nd harmonic . . . X 0.8

Power spectrum of the frequency component assuming 3rd harmonic . . . X 0.8 X 0.8

Power spectrum of the frequency component assuming 4th harmonic . . . X 0.8 X 0.8 X 0.8

Power spectrum of the frequency component assuming 5th harmonic . . . X 0.8 X 0.8 X 0.8 x 0.8

By exponentially assigning the weight as the sound becomes the higher harmonics component as mentioned above, the pitch can be accurately estimated.

In the embodiment, since the frequency component of the fundamental wave in which the sum of the power spectra of up to, for example, the harmonics of the fifth degree is maximum is estimated as a pitch, for instance, even in the case where the original signal is constructed by only noises, the pitch may be estimated on the basis of the estimating method above. The following index, therefore, may be introduced as a criteria (a reference of a discrimination) to identify the original signal as noises.

First, the sum ratio $$\sum_{i=1}^{p} M_l(i \cdot k_l)$$

of the normalized power spectra corresponding to the pitch $k_l$ obtained in the embodiment is obtained.

Then a logarithm value of the sum ratio, namely, $$10 \log_{10}\left\{\sum_{i=1}^{p} M_l(i \cdot k_l)\right\}$$

is obtained. The logarithm value is compared with a predetermined value, for example, −10 dB in the case where a white color noise of 0 dB has been multiplexed to the original signal. When the logarithm value is smaller than the predetermined value, it is decided that the original signal is a no-sound, noises, or a voiceless sound portion corresponding to "p", "t", or the like in a voice. That is, in case of a voiced sound, since it is known that as a sound becomes an harmonic component, its power spectrum exponentially decreases, the sum ratio is equal to almost 0 dB. In case of noises, however, the power spectra are almost uniformly distributed in the whole frequency band and are not deviated in a special frequency band. According to experiments, therefore, when considering the power spectra of, for example, the harmonics of up to fifth degree, the sum ratio is lower than −10 dB.

When the plural pitch frequencies detecting apparatus of the present invention is applied to a purpose for an automatic score making or the like, therefore, so long as it is determined by using the discrimination index that the sum ratio of the power spectra of the original signal is smaller than a predetermined value, it is decided that the original signal is no-sound without estimating the fundamental frequency. By replacing it to data indicative of a rest note corresponding to the no-sound interval, the score can be accurately collected.

There is, however, a case where a discrimination between the noises and the voiceless sound cannot be performed by the discrimination index. For example, therefore, when the plural pitch frequencies detecting apparatus of the invention is applied to an object for an audio sound extraction which is executed to synthesize the audio sounds or the like, in order to prevent that information of the voiceless sound is lost, even if the sum ratio of the power spectra of the original signal is smaller than a predetermined value, the voiceless sound is estimated as one component sound constructing a multi-voice part and is again synthesized together with the harmonics components of the estimated one component sound. In this instance, by using a principle that a discriminating ability of an auditory sense of human being for a voiceless sound is high, the amplitude of the estimated one component sound and the amplitude of the harmonics component are again synthesized in a state in which the amplitude is attenuated into, for example, 1/2, thereby enabling the noises to be suppressed without losing the information of the voiceless sound.

Although the Fourier coefficients have been averaged in the embodiment, it is not always necessary to carry out the averaging process. Namely, by using the Fourier coefficients obtained in either one or steps S15 and S16 or either one of steps S33 and S34, the pitch can be estimated to a certain degree. It is, however, preferable to execute the averaging process as shown in the embodiment in dependence on a system to which the invention is applied. In place of the averaging process, another proper process for generating a value correlating two values can be also used. Although the normalizing process is executed in step S56 in the flows of FIGS. 9, 10, and 12, it is performed to discriminate the maximum value with respect to the ratio for the total level of the energy levels of the components of all of the orthogonal function waves having waveforms each having the same start position and end position as those of the orthogonal function wave corresponding to the fundamental wave that is presumed. Thus it is also possible to replace the normalizing process to another equivalent process.

It will be understood that if an output of the analysis result in the analyzing unit 2 is supplied to the storing unit 4, the apparatus of the invention can be used as a frequency analyzing apparatus having no function of the pitch frequency estimation. Although all of the components of the harmonics of the fundamental wave are eliminated in step S62 in FIG. 10, further, it is also possible to eliminate the components of a predetermined number of harmonics to a certain degree such that the component of the pitch frequency other than the pitch frequency which has already been estimated in step S61 can be subsequently estimated.

According to the invention as described above, each fundamental frequency can be accurately estimated from the complex sound or the like with a relatively simple construction.

What is claimed is:

1. A frequency analyzing method of analyzing frequency components of an original signal, comprising:

a spectrum detecting step of detecting, from said original signal, energy levels of components of a predetermined number of orthogonal function waves which have waveforms each having a same start position and end position in a predetermined time window and in which the number of occurrences of periods in said predetermined time window or frequencies are different from each other; and an orthogonal function wave changing step of changing at least one of said start position and said end position in said predetermined time window to change a width of an analysis frame after completion of said spectrum detecting step, wherein said spectrum detecting step and said orthogonal function wave changing step are alternately repeated.

2. A method according to claim 1, further having a level correcting step of obtaining a value correlating with two values which are given, and wherein said spectrum detecting step has a first step of detecting, from said original signal, the energy levels of the components of a predetermined number of orthogonal function waves which have waveforms each having same fixed start position and variable end position in the predetermined time window and in which the number of occurrences of the periods in said predetermined time window or the frequencies are different from each other and a second step of detecting, from said original signal, the energy levels of the components of a predetermined number of orthogonal function waves which have waveforms each having same variable start position and fixed end position in said predetermined time window and in which the number of occurrences of the periods in said predetermined time window or the frequencies are different from each other, said orthogonal function wave changing step has a step of changing said variable end position in said predetermined time window after completion of said first step and changing said variable start position in said predetermined time window after completion of said second step, and said level correcting step has a step of calculating a value correlating with the energy level detected by said first step and the energy level detected by said second step with respect to the same orthogonal function wave.

3. A method according to claim 2, wherein in said level correcting step, an average value of said two values which are given is obtained as a correlating value.

4. A frequency analyzing method of analyzing a frequency on the basis of energy levels of components of a plurality of orthogonal function waves detected from an original signal, comprising:

an operation discriminating step of assuming that one of said orthogonal function waves is set to a fundamental wave, executing an operation to obtain the sum of the energy level of the component of said orthogonal function wave corresponding to the fundamental wave and the energy levels of components of a predetermined number of orthogonal function waves corresponding to harmonics of said fundamental wave and having waveforms each having the same start position and end position as those of said fundamental wave in a predetermined time window each time said orthogonal function wave which is assumed as the fundamental wave is switched, and of discriminating one of the sums obtained by the operations which is regarded such that a ratio to a total level of said energy levels of the components of all of said orthogonal function waves having waveforms each having the same start position and end position as those of said orthogonal function wave corresponding to the assumed fundamental wave is largest;

a repeating step of changing at least one of said start position and said end position within said predetermined time window and allowing said operation discriminating step to be executed; and an estimating step of selecting the largest sum among all of the sums discriminated by said operation discriminating step as a result of said repeating step and estimating a pitch frequency from a period or a frequency of said orthogonal function wave corresponding to said fundamental wave presumed in said operation by which said selected sum was obtained.

5. A method according to claim 4, wherein said predetermined number is equal to 5.

6. A method according to claim 4, wherein said operation discriminating step has:

a normalizing step of normalizing, with respect to said total level, the energy levels of the components of all of the orthogonal function waves having waveforms each having the same start position and end position with those of the orthogonal function wave corresponding to the presumed fundamental wave;

a step of executing said operation on the basis of the energy levels obtained by said normalizing step; and a step of discriminating the largest one of the sums obtained by said operation.

7. A method according to claim 5, wherein said operation discriminating step has:

a normalizing step of normalizing, with respect to said total level, the energy levels of the components of all of the orthogonal function waves having waveforms each having the same start position and end position with those of the orthogonal function wave corresponding to the presumed fundamental wave;

a step of executing said operation on the basis of the energy levels obtained by said normalizing step; and a step of discriminating the largest one of the sums obtained by said operation.

8. A plural pitch frequencies detecting method of detecting each pitch frequency of an original signal by using a frequency analyzing method, wherein said frequency analyzing method is a method of analyzing a frequency on the basis of energy levels of components of a plurality of orthogonal function waves detected from said original signal and comprises:

an operation discriminating step of assuming that one of said orthogonal function waves is set to a fundamental wave, executing an operation to obtain the sum of the energy level of the component of said orthogonal function wave corresponding to the fundamental wave and the energy levels of components of a predetermined number of orthogonal function waves corresponding to harmonics of said fundamental wave and having waveforms each having the same start position and end position as those of said fundamental wave in a predetermined time window each time said orthogonal function wave which is assumed as a fundamental wave is switched, and of discriminating one of the sums obtained by the operations which is regarded such that a ratio to a total level of said energy levels of the components of all of said orthogonal function waves having waveforms each having the same start position and end position as those of said orthogonal function wave corresponding to the assumed fundamental wave is largest;

a repeating step of changing at least one of said start position and said end position within said predetermined time window and allowing said operation discriminating step to be executed; and an estimating step of selecting the largest sum among all of the sums discriminated by said operation discriminating step as a result of said repeating step and estimating a pitch frequency from a period or a frequency of said orthogonal function wave corresponding to said fundamental wave presumed in said operation by which said selected sum was obtained, said pitch frequencies detecting method further has an eliminating step of eliminating from the original signal the component of the orthogonal function wave corresponding to the pitch frequency estimated by the estimating step and the components of the orthogonal function waves corresponding to harmonics of the fundamental wave corresponding to the estimated pitch frequency, wherein a residual component of the original signal which is obtained as a result of the eliminating step is set to a new original signal and each of the above steps is repeated.

9. A plural pitch frequencies detecting method according to claim 8, wherein said predetermined number is equal to 5.

10. A plural pitch frequency detecting method according to claim 8, wherein said operation discriminating step has:

a normalizing step of normalizing, with respect to said total level, the energy levels of the components of all of the orthogonal function waves having waveforms each having the same start position and end position with those of the orthogonal function wave corresponding to the presumed fundamental wave;

a step of executing said operation on the basis of the energy levels obtained by said normalizing step; and a step of discriminating the largest one of the sums obtained by said operation.

11. A plural pitch frequencies detecting method of detecting each pitch frequency of an original signal, comprising:

a spectrum detecting step of detecting, from said original signal, energy levels of components of a predetermined number of orthogonal function waves which have waveforms each having same start position and end position in a predetermined time window and in which the number of occurrences of periods in said predetermined time window or frequencies are different from each other;

an operation discriminating step of assuming that one of said orthogonal function waves regarding the energy level which is obtained by said spectrum detecting step is set to a fundamental wave, executing an operation to obtain the sum of the energy level of the component of said orthogonal function wave corresponding to the fundamental wave and the energy levels of components of a predetermined number of orthogonal function waves corresponding to harmonics of said fundamental wave and having waveforms each having the same start position and end position as those of said fundamental wave in a predetermined time window each time said orthogonal function wave which is assumed as a fundamental wave is switched, and of discriminating one of the sums obtained by said operations which is regarded such that a ratio to a total level of the energy levels of the components of all of said orthogonal function waves having waveforms each having the same start position and end position as those of said orthogonal function wave corresponding to the assumed fundamental wave is largest;

a repeating step of changing at least one of said start position and said end position within said predetermined time window and allowing said spectrum detecting step and said operation discriminating step to be executed;

an estimating step of selecting the largest sum among all of the sums discriminated by said operation discriminating step as a result of said repeating step and estimating a pitch frequency from a period or a frequency of said orthogonal function wave corresponding to said fundamental wave presumed in said operation by which the selected sum was obtained; and an eliminating step of eliminating from said original signal the component of said orthogonal function wave corresponding to said pitch frequency estimated by said estimating step and the components of said orthogonal function waves corresponding to harmonics of said fundamental wave corresponding to the estimated pitch frequency, wherein a residual component of said original signal which is obtained as a result of said eliminating step is set to a new original signal and each of said steps is repeated.

12. A frequency analyzing apparatus for analyzing a frequency component of an original signal, comprising:

spectrum detecting means for detecting, from said original signal, energy levels of components of a predetermined number of orthogonal function waves which have waveforms each having same start position and end position in a predetermined time window and in which the number of occurrences of periods in said predetermined time window or frequencies are different from each other; and orthogonal function wave changing means for changing at least one of said start position and said end position in said predetermined time window to change a width of an analysis frame each time the energy levels of the components of said predetermined number of orthogonal function waves are detected.

13. A frequency analyzing apparatus for analyzing a frequency on the basis of energy levels of components of a plurality of orthogonal function waves detected from an original signal, comprising:

operation discriminating means for assuming that one of said orthogonal function waves is set to a fundamental wave, executing an operation to obtain the sum of the energy level of the component of said orthogonal function wave corresponding to the fundamental wave and the energy levels of components of a predetermined number of orthogonal function waves corresponding to harmonics of said fundamental wave and having waveforms each having the same start position and end position as those of said fundamental wave in a predetermined time window each time said orthogonal function wave which is assumed as a fundamental wave is switched and of discriminating one of the sums obtained by said operations which is regarded such that a ratio to a total level of the energy levels of the components of all of said orthogonal function waves having waveforms each having the same start position and end position as those of said orthogonal function wave corresponding to the assumed fundamental wave is largest;

changing means for changing at least one of said start position and said end position within said predetermined time window every predetermined number of orthogonal function waves having waveforms each having the same start position and the same end position; and estimating means for selecting the largest sum among all of the sums discriminated by said operation discriminating means every predetermined number of orthogonal function waves having the waveforms each having the same start position and the same end position and estimating a pitch frequency from a period or a frequency of said orthogonal function wave corresponding to said fundamental wave presumed in said operation by which the selected sum was obtained.

14. A plural pitch frequencies detecting apparatus for detecting each pitch frequency of an original signal, comprising:

spectrum detecting means for detecting, from said original signal, energy levels of components of a predetermined number of orthogonal function waves which have waveforms each having same start position and end position in a predetermined time window and in which the number of occurrences of periods in said predetermined time window or frequencies are different from each other;

operation discriminating means for assuming that one of said orthogonal function waves regarding the energy level which is obtained by said spectrum detecting means is set to a fundamental wave, executing an operation to obtain the sum of the energy level of the component of said orthogonal function wave corresponding to the fundamental wave and the energy levels of components of a predetermined number of orthogonal function waves corresponding to harmonics of said fundamental wave and having waveforms each having the same start position and end position as those of said fundamental wave in a predetermined time window each time said orthogonal function wave which is assumed as a fundamental wave is switched and of discriminating one of the sums obtained by said operations which is regarded such that a ratio to a total level of the energy levels of the components of all of said orthogonal function waves having waveforms each having the same start position and end position as those of said orthogonal function wave corresponding to the assumed fundamental wave is largest;

changing means for changing at least one of said start position and said end position within said predetermined time window every predetermined number of orthogonal function waves having waveforms each having said same start position and said same end position;

estimating means for selecting the largest sum among all of the sums discriminated by said operation discriminating means every predetermined number of orthogonal function waves having the waveforms each having the same start position and the same end position and estimating a pitch frequency from a period or a frequency of said orthogonal function wave corresponding to said fundamental wave presumed in said operation by which the selected sum was obtained; and eliminating means for eliminating from said original signal the component of said orthogonal function wave corresponding to said pitch frequency estimated by said estimating means and the components of said orthogonal function waves corresponding to harmonics of said fundamental wave corresponding to the estimated pitch frequency, wherein a residual component of said original signal which is obtained as a result of said eliminating means is supplied as a new original signal to said spectrum detecting means.

15. A frequency analyzing method according to claim 1, further comprising a step of:

obtaining respective energy levels of the same frequency components of a plurality of analysis frames, the frames having the same width and located at different positions in said predetermined time window, to average a plurality of said energy levels.

16. A frequency analyzing apparatus according to claim 12, further comprising:

means for obtaining respective energy levels of the same frequency components of a plurality of analysis frames, the frames having the same width and located at different positions in said predetermined time window, to average a plurality of said energy levels.

* * * * *